United States Patent [19]

Hersener et al.

[11] 4,243,742
[45] Jan. 6, 1981

[54] RADIATION-SENSITIVE POSITIVELY ACTING MATERIALS

[75] Inventors: Jürgen Hersener; Alfred Wilhelm, both of Ulm, Fed. Rep. of Germany

[73] Assignee: Licentia Patent-Verwaltungs-G.m.b.H., Frankfurt am Main, Fed. Rep. of Germany

[21] Appl. No.: 972,801

[22] Filed: Dec. 26, 1978

[30] Foreign Application Priority Data

Dec. 24, 1977 [DE] Fed. Rep. of Germany ....... 2757932

[51] Int. Cl.$^3$ .............................................. G03C 1/68
[52] U.S. Cl. ............................... 430/270; 204/159.14; 204/159.22; 430/296; 526/292
[58] Field of Search ................. 96/115 R; 204/159.14, 204/159.22; 430/270, 296; 526/292; 427/43.1

[56] References Cited

U.S. PATENT DOCUMENTS

| | | | |
|---|---|---|---|
| 3,981,985 | 9/1976 | Roberts | 427/43 |
| 4,035,321 | 7/1977 | Shahidi et al. | 96/115 R |
| 4,061,832 | 12/1977 | Roberts | 428/509 |
| 4,157,261 | 6/1979 | Takeda | 96/115 R |

FOREIGN PATENT DOCUMENTS 2363092 7/1974 Fed. Rep. of Germany .
2610301 3/1976 Fed. Rep. of Germany .

OTHER PUBLICATIONS

*Chemical Abstracts,* vol. 86 (1977) Abstract No, 197885, Roberts.
Haller et al., IBM Journal (5/1968) "High–Resolution Positive Resist for Electron Exposure".

*Primary Examiner*—Jack P. Brammer
*Attorney, Agent, or Firm*—Spencer & Kaye

[57] ABSTRACT

Radiation-sensitive positively acting materials for ultraviolet, electron beam or X-ray lithography based on linear non-crosslinked copolymers of acrylic acid or methacrylic acid or derivatives of these acids, which copolymers have side chains of different length. Copolymers are provided comprising three or more monomers and corresponding to the general form of copolymer ABC, in which monomer A represents a compound or several compounds of the formula:

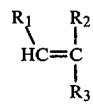

monomer B represents a compound of the formula:

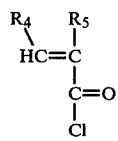

and monomer C represents a compound of the formula:

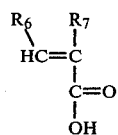

in which $R_1$, $R_2$, $R_4$, $R_5$, $R_6$ and $R_7$ are hydrogen atoms, acrylic or alkyl groups and $R_3$ are ester or ketone groups.

15 Claims, No Drawings

RADIATION-SENSITIVE POSITIVELY ACTING MATERIALS

BACKGROUND OF THE INVENTION

The invention relates to radiation-sensitive positively acting materials for ultraviolet, electron or X-ray beam lithography on the basis of linear non-crosslinked polymer acrylic acid or methacrylic acid derivatives having side chains of different length.

Radiation-sensitive materials are generally high-molecular polymer organic compounds having average molecular weights of approximately $5 \cdot 10^3$ to $5 \cdot 10^6$, which compounds change their solubility properties with respect to specific solvents under the action of energy-rich radiation. Positively acting materials are depolymerized by energy-rich radiation and thus are more soluble, whereas negatively acting materials are crosslinked and therefore less easily soluble.

The lowest possible radiation dose which is necessary for depolymerization or crosslinking of a material with a certain layer thickness gives the sensitivity of the respective material.

These compounds designated as resistant materials are preferably used as etching masks for producing microstructures of high resolution in semiconductor technology.

Positively acting resistant materials on the basis of polymethacrylates are known and are described by J. Haller et al (IBM Journal Res. 12. 251, 1968) and others. Similarly copolymers of methacrylic acid esters having organic acids or chlorides containing polymerizable double bonds are known and these are quasi crosslinked by treatment with water-vapour-enriched nitrogen by forming acid anhydride groups and are depolymerized by means of energy-rich radiation, c.f. German Offenlegungsschrift Nos. 23 63 092 and 26 10 301.

By crosslinking and subsequently depolymerizing the copolymers described in German Offenlengungsschrift No. 26 10 301, a sensitivity of 30–60/uC/cm² is said to be achieved, this sensitivity being relatively low in comparison with comparable values of other known resistant materials. These other known materials do however have other disadvantages such as adhesive problems for example and lower resistance to etching in different media such as for example when structuring aluminum substrates.

SUMMARY OF THE INVENTION

The object underlying the invention is to provide positively acting and not previously crosslinked materials which have high radiation sensitivity and are characterized by good properties of application, such as coating, adhesive strength, developing, etching resistance and stripping at the end of masking steps.

This object is solved in accordance with the invention by providing radiation-sensitive positively acting materials for ultraviolet, electronbeam or X-ray lithography based on linear non-crosslinked copolymers of acrylic acid or methacrylic acid or derivatives of these acids, which copolymers have side chains of different length, and which copolymers comprise three or more monomers and correspond to the general form of copolymer ABC, in which monomer A represents a compound or several compounds of the formula:

monomer B represents a compound of the formula:

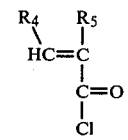

and monomer C represents a compound of the formula:

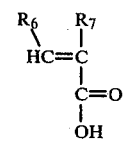

in which $R_1$, $R_2$, $R_4$, $R_5$, $R_6$, $R_7$ are in each case hydrogen atoms, acryl or alkyl groups and $R_3$ are ester or ketone groups.

Preferably methacrylic acid esters or mixtures of methacrylic acid esters with α-alkenylene ketones are used as monomer A, acryloyl, methacryloyl and crotonyl chloride are used as monomer B and an organic acid containing polymerizable double bonds, preferably acrylic, methacrylic or crotonic acid are used as monomer C.

Copolymers ABC are desirably prepared by radical initiated copolymerization in a substance or in suitable solvents in an inert gas atmosphere while excluding oxygen and air humidity at temperatures between 50° and 100° C. and can be obtained in solid form by means of precipitation. The mixing ratios of monomers ABC in copolymers ABC preferably lie between 98:1; 1 and 33.3:33.3:33.3% (percent by weight).

Chlorinated hydrocarbons, esters, ketones, benzene or substituted benzenes etc. are suitable as solvents during polymerization. Azoiso butyronitrile or benzoylperoxides can be used as initiators.

DESCRIPTION OF PREFERRED EMBODIMENT

The following describes the preparation of PMCL-COOH from the series of copolymers ABC. (A copolymer made from methacrylic acid methyl ester, methacryl chloride and methacrylic acid.

A mixture of 89% methacrylic acid methyl ester, 10% methacryloyl chloride and 1% methacrylic acid is dissolved in ethylmethyl ketone, mixed with 1% perkadox (2,4-dichlorobenzoylperoxide) and is polymerized in an inert gas atmosphere at different temperatures and different lengths of time (the percentages are to be understood as percentages by weight, the starting monomers are freshly distilled). After precipitating in petrol benzine and several reprecipitation processes from ethylmethyl ketone with petrol benzine and drying in a vacuum at 23° C. the yields in theory are at 10–60%. A 10% solution of one of these copolymers (polymerization time three hours at 72° C.) produces coating thicknesses of 0.1 μm to 1 μm which thicknesses are dependent on the rotational speed during spin coating on different substrates. The layers can be depolymerized by means of UV radiation, X-ray or electron beam radiation without tempering or after a short prebake process above the glass temperature while excluding oxygen and air humidity.

The prebake process is carefully carried out in an inert gas atmosphere with complete exclusion of air humidity in order to harden the coating layers and increase the adhesive strength to the respective substrate materials. Crosslinking is avoided by this prebake process.

The exposure with an electron beam requires a beam dose of $2 \cdot 10^{-5}$ to $5 \cdot 10^{-7}$ C/cm$^2$, depending on the beam energy, coating thickness and prebake duration of the layers. The exposure with ultraviolet light is carried out by means of quartz masks and mercury high-pressure lamps in the effective range of emission of 180 to 300 nm. Exposure with soft X-ray radiation is carried out preferably in the wavelength range of 0.2 to 20 nm. The irradiated regions are developed by organic developer solutions preferably aliphatic ketones, the developing durations lying between 30 seconds and 2 minutes. The developing process can be accelerated by the supply of heat. After a short post-bake process at temperatures between 50° and 130° C. the substrate materials can be structured by means of etching solutions or by means of sputter etching where by the covering properties of the coating are sufficiently good. After completing the masking steps the residues of coating are dissolved away in chlorinated hydrocarbons or keytones or made soluble in these solvents in a short depolymerization step by means of UV radiation. If the structured substrate permits, chromium sulphuric acid can also be used as a solvent.

The representation of PMICL-COOH—another copolymer from the series ABC—is carried out similarly to the preparation of PMCL-COOH, the composition of the starting monomers, methacrylic acid methyl ester, isopropenyl methyl ketone, methacryl chloride (acryl chloride) and methacrylic acid amounts to 84:5:10:1 percent by weight.

The coating, tempering, exposure, developing, etching and removal of the coating are also carried out in a similar manner to PMCL-COOH.

It will be understood that the above description of the present invention is susceptible to various modifications, changes and adaptions.

What is claimed is:

1. A radiation-sensitive positively acting material for ultraviolet, electron beam or X-ray lithography, which material comprises a depolymerizable linear non-crosslinked copolymer having side chains of different length and which copolymer consists essentially of monomers A, B, and C, in which monomer A represents one or more compounds of the formula:

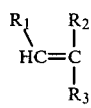

monomer B represents a compound of the formula:

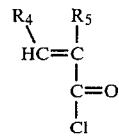

and monomer C represents a compound of the formula:

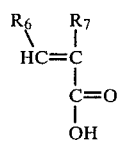

in which $R_1$, $R_2$, $R_4$, $R_5$, $R_6$, $R_7$ are hydrogen atoms, acrylic or aklyl groups and $R_3$ are ester or ketone groups.

2. Radiation-sensitive positively acting material as claimed in claim 1, in which monomer A is methacrylic acid ester, monomer B is selected from the group consisting of acryloyl, methacryloyl and crotonyl chloride, and monomer C is selected from the group consisting of acrylic-, methacrylic-, and crotonic acid.

3. Radiation-sensitive positively acting material as claimed in claim 1, in which monomer A is methyacrylic acid ester and α-alkenyl ketone, monomer B is selected from the group consisting of acryloyl, methacryloyl and crotonyl chloride, and monomer C is selected from the group consisting of acrylic-, methacrylic- and crotonic acid.

4. Radiation-sensitive positively acting material as claimed in claim 1, in which said material is prepared by radical initiated polymerization or copolymerization with the exclusion of humidity in an inert gas atmosphere at temperatures of between 50° and 100° C. and in which the mixture ratios of the monomers A, B and C in terms of percent by weight in the copolymer are between 98:1:1 and 33.3:33.3:33.3.

5. Radiation-sensitive positively acting materials as claimed in claim 1, in which the copolymer has an average molecular weight of between $5 \cdot 10^3$ and $5 \cdot 10^6$.

6. Radiation-sensitive positively acting material as claimed in claim 1, in which the copolymer comprises a compound made up of 89% methacrylic acid methyl ester, 10% methacryloyl chloride and 1% methacrylic acid.

7. Radiation-sensitive positively acting material as claimed in claim 1, in which the copolymer comprises a compound made up of 84% of methacrylic acid methyl ester, 5% of isopropenyl methyl ketone, 10% of methacryloyl chloride and 1% of methacrylic acid.

8. Radiation-sensitive positively acting material as claimed in claim 1, in which said material can be depolymerized by UV light in the effective emission range of between 180 and 300 nm, by means of X-ray radiation, or by means of electron beam radiation with a dose $2 \cdot 10^{-5}$ to $5 \cdot 10^{-7}$ C/cm$^2$, said dose being dependent on the beam energy, thickness of the coating and prebake duration.

9. Radiation-sensitive positively acting material as claimed in claim 1, in which said X-ray radiation has a wavelength range of 0.2 to 20 nm.

10. Radiation-sensitive positively acting material as claimed in claim 8, in which said beam dose is $1-5 \cdot 10^{-6}$ C/cm$^2$.

11. Radiation-sensitive positively acting material as claimed in claim 8, in which said material can be developed after irradiation in aliphatic ketones.

12. Radiation-sensitive positively acting material as claimed in claim 11, wherein said aliphatic ketone is methyl isobutyl ketone.

13. Radiation-sensitive positively acting material as claimed in claim 8, in which said material after etching is soluble in organic or inorganic solvents.

14. Radiation-sensitive positively acting material as claimed in claim 13, wherein said solvents are chlorinated hydrocarbons or chromium sulphuric acid.

15. Radiation-sensitive positively acting material as claimed in claim 5, wherein said material, after etching, is made soluble by means of a short depolymerization step with the aid of ultraviolet light.

* * * * *